(12) United States Patent
Dubin et al.

(10) Patent No.: US 7,709,873 B2
(45) Date of Patent: May 4, 2010

(54) POLYMER MEMORY WITH ADHESION LAYER CONTAINING AN IMMOBILIZED METAL

(75) Inventors: Valery M. Dubin, Portland, OR (US); Ebrahim Andideh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 459 days.

(21) Appl. No.: 11/096,389

(22) Filed: Mar. 31, 2005

(65) Prior Publication Data

US 2006/0220080 A1    Oct. 5, 2006

(51) Int. Cl.
*H01L 29/76* (2006.01)
*H01L 29/74* (2006.01)
*H01L 31/062* (2006.01)
*H01L 31/113* (2006.01)
*H01L 31/119* (2006.01)

(52) U.S. Cl. ....................................................... 257/295
(58) Field of Classification Search ................... 257/295
See application file for complete search history.

(56) References Cited

U.S. PATENT DOCUMENTS

| | | | | |
|---|---|---|---|---|
| 5,262,920 A | * | 11/1993 | Sakuma et al. | 361/321.5 |
| 5,665,628 A | * | 9/1997 | Summerfelt | 438/3 |
| 5,696,207 A | * | 12/1997 | Vargo et al. | 525/326.2 |
| 6,344,309 B2 | * | 2/2002 | Fukushima et al. | 430/324 |
| 6,798,003 B2 | * | 9/2004 | Li et al. | 257/295 |
| 2001/0055934 A1 | * | 12/2001 | Cheung | 451/28 |

* cited by examiner

*Primary Examiner*—Howard Weiss
(74) *Attorney, Agent, or Firm*—Blakely, Sokoloff, Taylor & Zafman LLP

(57) ABSTRACT

An embodiment mitigates one or more of the limiting factors of fabricating polymer ferroelectric memory devices. For example, an embodiment reduces the degradation of the ferroelectric polymer due to the polymer's reaction with, and migration or diffusion of, adjacent metal electrode material. Further, the ferroelectric polymer is exposed to fewer potentially high temperature or high energy processes that may damage the polymer. An embodiment further incorporates an immobilized catalyst to improve the adhesion between adjacent layers, and particularly between the electrolessly plated electrodes and the ferroelectric polymer.

20 Claims, 11 Drawing Sheets

POLYMER MEMORY WITH ADHESION LAYER CONTAINING AN IMMOBILIZED METAL

FIELD

Embodiments of the invention relate to ferroelectric memory, and more specifically to extending the useful life of a ferroelectric memory device by reducing the ferroelectric material degradation during fabrication and operation.

BACKGROUND

Memory manufacturers are currently researching and developing the next generation of memory devices. One such development includes technology designed to replace current volatile and non-volatile memory technologies. Important elements of a successor include compactness, low price, low power operation, non-volatility, high density, fast read and write cycles, and long life.

Current memory technology is predicted to survive into 45 nanometer process generations. This survival is in part based on, for example, exotic storage dielectric materials, cobalt and nickel source and drain regions, copper and low dielectric constant materials for the interconnect levels, and high dielectric constant materials for transistor gates. However, there will thereafter exist a need for new memory materials and technology, particularly for non-volatile memory.

Ferroelectric memory is one such successor technology. A ferroelectric memory device combines the non-volatility of Flash memory with improved read and write speeds, high endurance, and low power consumption. Simply stated, ferroelectric memory devices rely on the use of ferroelectric materials that can be spontaneously polarized by an applied voltage or electric field and that maintain the polarization after the voltage or field has been removed. As such, a ferroelectric memory device can be programmed with a binary "1" or "0" depending on the orientation of the polarization. The state of the memory device can then be detected during a read cycle.

Two crystalline materials have emerged as promising films utilized in a ferroelectric memory scheme, namely lead zirconium titanate ("PZT") and strontium bismuth tantalite ("SBT"). However, while the materials exhibit appropriate ferromagnetic properties, each is nevertheless expensive to integrate into an existing CMOS process.

More recent developments include the use of polymers that exhibit ferroelectric properties. The creation of polymer ferroelectric memory utilizes polymer chains with net dipole moments. Data is stored by changing the polarization of the polymer chain between metal lines that sandwich the layer comprised of the ferroelectric polymer chain. Further, the layers can be stacked (e.g., metal word line, ferroelectric polymer, metal bit line, ferroelectric polymer, metal word line, etc.) to improve memory element density. The polymer ferroelectric memory devices exhibit microsecond initial read speeds coupled with write speeds comparable to Flash.

DETAILED DESCRIPTION

Figure 1:
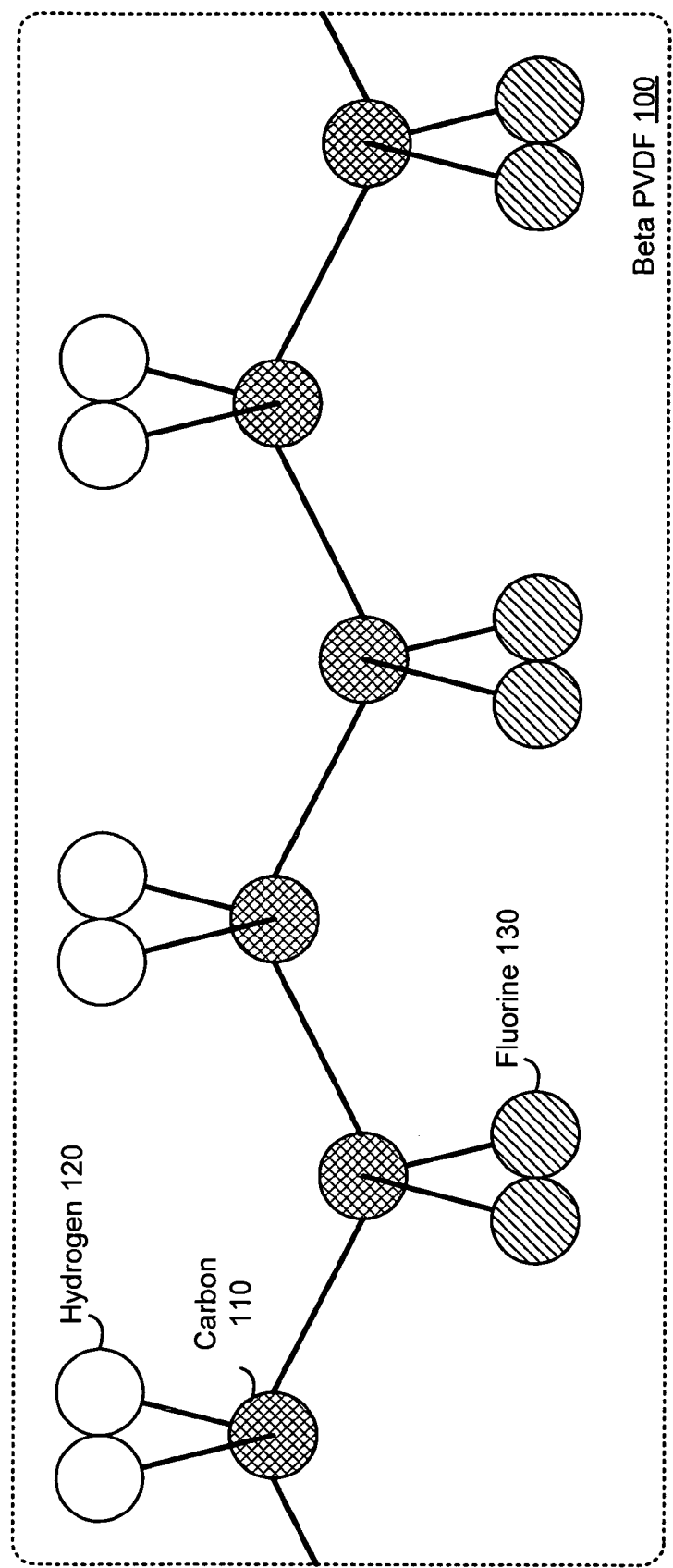
FIG. 1: illustration of a ferroelectric beta phase polyvinylidene fluoride (PVDF) molecule chain

Embodiments of a polymer ferroelectric memory and method of fabrication are described. Reference will now be made in detail to a description of these embodiments as illustrated in the drawings. While the embodiments will be described in connection with these drawings, there is no intent to limit them to drawings disclosed herein. On the contrary, the intent is to cover all alternatives, modifications, and equivalents within the spirit and scope of the described embodiments as defined by the accompanying claims.

Simply stated, an embodiment of the invention is a polymer ferroelectric memory including an arrangement of layers and deposition process that together mitigate a myriad of functional and fabrication challenges. In particular, and among other features, the design of an embodiment reduces the degradation of the polymer memory due to the polymer's reaction with, and migration or diffusion of, adjacent metal electrode material. Further, the polymer memory of an embodiment is exposed to fewer high temperature or high energy processes that may damage the polymer. It also mitigates the need for additional dielectric layers adjacent to the metal electrodes that, among other detriments, contribute to the parasitic capacitance of the electrodes. The embodiment finally incorporates an immobilized catalyst to improve the adhesion between electrolessly plated electrodes and adjacent layers and particularly between the electrolessly plated electrodes and the ferroelectric polymer.

As noted, a large portion of the historical research in ferroelectric memory device technology has centered on select crystalline materials such as PZT and SBT. More current trends, however, include utilizing polymer chains that exhibit ferroelectric properties. Polyvinylidene Fluoride ("PVDF") is a fluoropolymer with alternating $CH_2$ and $CF_2$ groups for which the relative electron densities between the hydrogen and fluorine atoms create a net ionic dipole moment. FIG. 1 illustrates the ferroelectric beta phase PVDF 100, including a chain of carbon 110 and alternating and opposing hydrogen 120 and fluorine 130 pairs. A particular PVDF copolymer is polyvinylidene fluoride trifluoroethylene ("PVDF-TrFE"). The addition of the trifluoroethylene $C_2HF_3$ (essentially substituting a hydrogen with a fluorine versus PVDF) in the chain reduces the overall theoretical ionic dipole moment of a ferroelectric PVDF beta phase chain, but increases the likelihood of forming the ferroelectric PVDF beta phase versus the paraelectric PVDF alpha phase during crystallization. The crystalline PVDF-TrFE polymer is ferroelectric in that it can be given a remnant polarization that can be switched in a sufficiently high electric field (i.e., a coercive field). The polarization can be used to store a binary "0" state and a binary "1" state of a memory device fabricated therewith based on the orientation of the polarization.

Memory elements utilizing polymer ferroelectric materials can be passive in the sense that there is no need for active components (e.g., a transistor coupled to a MOS capacitor in DRAM). Data is stored by changing the polarization of the polymer chain between metal electrode lines that sandwich the layer comprised of the ferroelectric polymer. The elements are driven externally by applying a voltage to the appropriate word and bit lines to read or write to a polymer ferroelectric memory cell. Configured as such, the read cycle is destructive and the memory cell must be rewritten.

Figure 2:
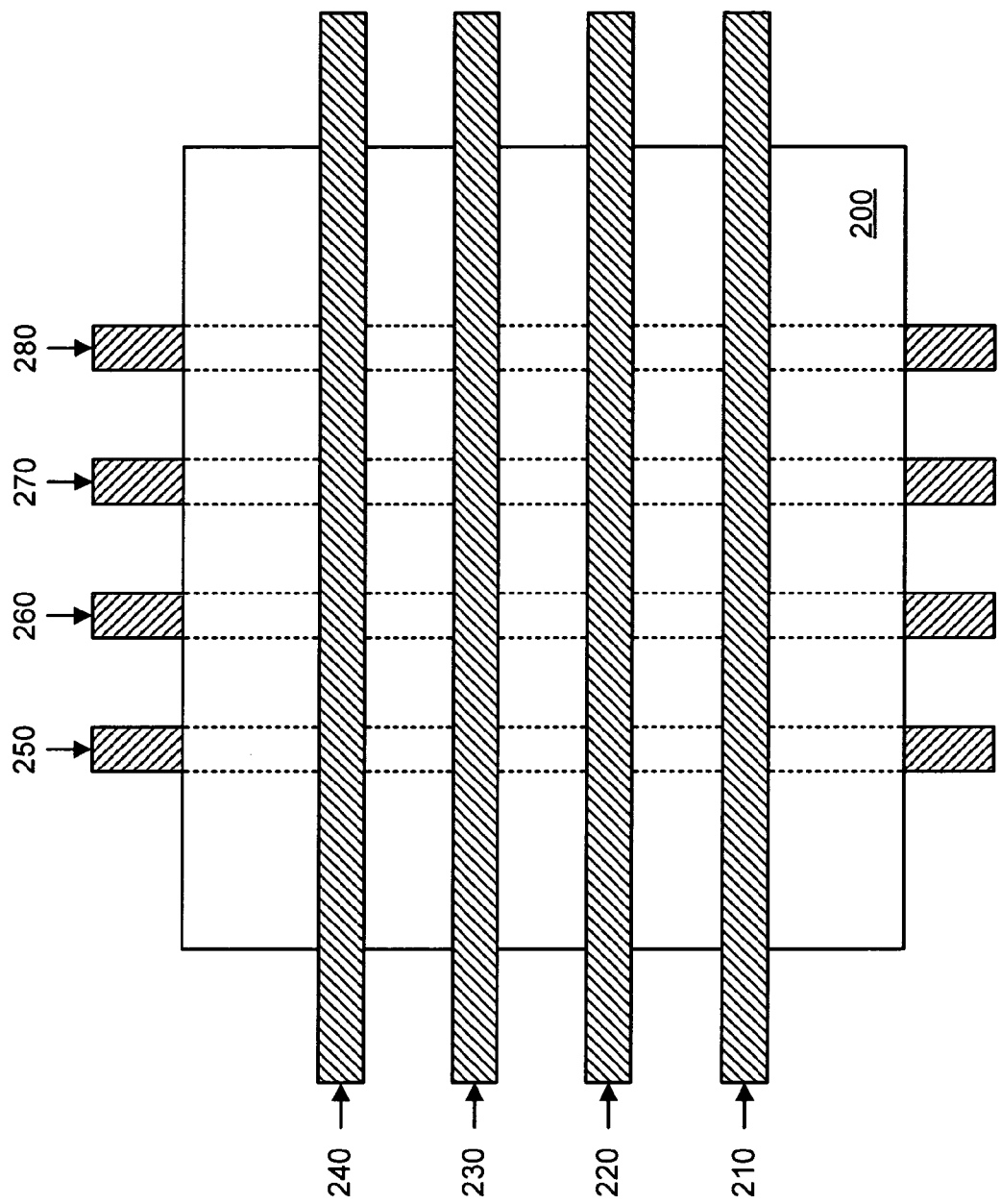
FIG. 2: illustration of a top view of a ferroelectric polymer memory device

FIG. 2 illustrates a top view of a single layer polymer ferromagnetic memory device. Bit lines 250-280 and word lines 210-240 sandwich a layer of polymer ferroelectric material 200. When a voltage is applied across overlapping bit and word lines (e.g., bit line 250 and word line 240) a number of operational processes are possible. A relatively high voltage (e.g., ranging approximately between 5 and 15 volts), can create a coercive electric field sufficient to program a binary "1" state or a binary "0" state based on altering the orientation of the remanent polarization of the polymer ferroelectric material 200 sandwiched between the bit and word lines 250 and 240 respectively. A separate voltage can be applied, in conjunction with external detection circuitry not illustrated, to read the binary state of the memory cell. The sequence of applying alternating voltages to write and/or read the cells of the polymer ferroelectric material subjects the polymer contained within the memory cell to an AC bias. For example, one read or write cycle may expose the cell to a positive voltage difference between the word and bit line while another read or write cycle may expose the cell to a negative voltage difference between the word and bit line.

There are a variety of processing and operational challenges associated with polymer ferroelectric memory devices. One challenge is to isolate the polymer from the electrodes (e.g., the metal bit and word lines that sandwich the ferroelectric polymer layer) as the electrode metal tends to migrate or diffuse into the ferroelectric polymer and causes a damaging reaction. Another challenge involves depositing electrode metal atop the polymer with CVD, PVD, or ALD as each potentially utilizes a high deposition temperature, imparts high energy flux with incident atoms or ions, or a combination thereof. A further challenge involves the use of a barrier layer (i.e., to mitigate the electrode metal diffusion into the ferroelectric polymer) as, depending on material choice, the barrier layer may create parasitic capacitance and/or a reacted polymer layer within the ferroelectric polymer layer altering the performance of the ferroelectric polymer. Additionally, multiple-layered polymer ferroelectric memory requires many expensive PVD, CVD, or ALD metal electrode deposition steps.

Figure 3:
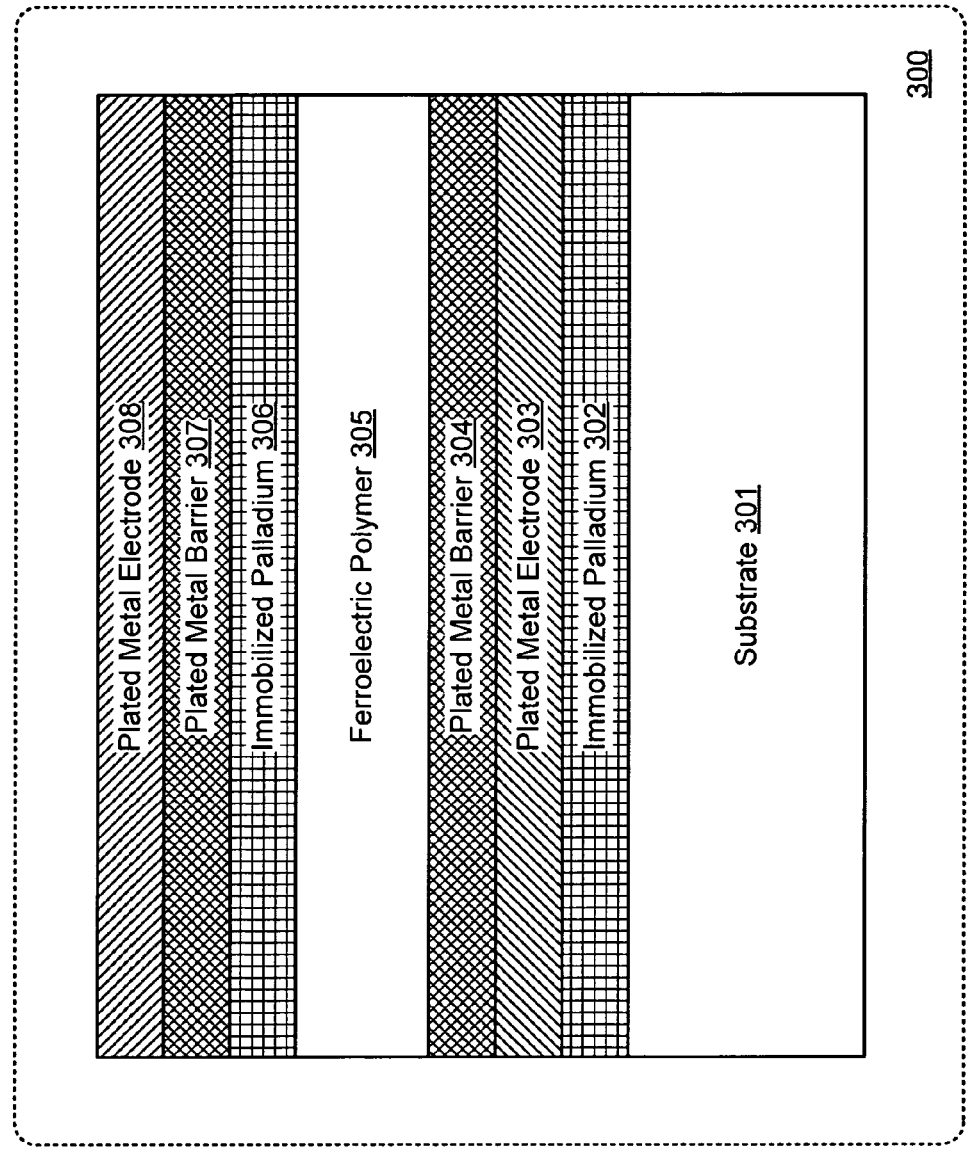
FIG. 3: illustration of a schematic cross section of a ferroelectric polymer memory device of an embodiment

FIG. 3 illustrates a schematic cross section of a polymer ferroelectric memory 300 of an embodiment incorporating features that address the operational and process challenges introduced above. The substrate 301 onto which the polymer ferroelectric memory is fabricated can be any substrate onto which it would be useful to fabricate a memory device, ranging from, for example, a bulk silicon wafer to a top interconnect, dielectric, or passivation layer.

Atop the substrate 301 is initially formed a layer of immobilized palladium 302. The immobilized palladium 302 improves the adhesion between the substrate 301 and the subsequent metal layer or layers deposited with electroless plating as will be described below. In an embodiment, the immobilized palladium 302 is a monolayer.

The layer of immobilized palladium 302 acts as an immobilized catalyst on the surface of the substrate 301 to promote interaction between the substrate 301 and, for example, plated electrode 303. A catalyst is a reaction facilitator that acts by providing a different and faster reaction mechanism than is possible in the absence of the catalyst. In this case, the inclusion of the catalytic immobilized palladium promotes adhesion between the substrate 301 and the plated metal electrode 302.

The next layer adjacent to the immobilized palladium 302 is a plated metal electrode 303. The plated metal electrode 303 will form, for example, bit lines 250-280 as illustrated by FIG. 2. In an embodiment, the plated metal electrode 303 comprises Au, Ru, Rh, Pd, Pt, Ag, Co, Ni, Cu, Ir, Os, and/or alloys thereof with W, Mo, Re, P, B, and/or N. The plated metal electrode 303 of an embodiment is deposited with an electroless plating process.

The next layer of an embodiment is a plated metal barrier 304 in contact with the ferroelectric polymer 305. The plated metal barrier 304 of an embodiment includes CoWP, CoWPB, CoWB, CoWMoP, CoWMoPB, CoWMoB, CoWReP, CoWRePB, CoWReB, CoMoP, CoMoPB, CoMoB, CoReP, CoRePB, CoReB, CoMoReP, CoMoRePB, CoWMoReP, CoWMoReB, CoWMoReBP, CoMoReB, CoP, CoBP, or CoB. In an embodiment, the plated metal barrier 304 further includes nitrogen. The plated metal barrier 304 decreases or prevents a reaction between the plated metal electrode 304 material and the ferroelectric polymer 305 material that would otherwise be in contact but for the plated metal barrier 304. The plated metal barrier 304 further decreases or prevents the diffusion and migration of the plated metal electrode 303 material into the ferroelectric polymer 305 that may contribute to the degradation of the ferroelectric polymer 305. The plated metal barrier 304 of an embodiment is deposited with electroless plating techniques, the features and benefits of which have been described with reference to plated metal electrode 303.

The next layer of an embodiment is a ferroelectric polymer 305. As noted with respect to FIG. 1, in an embodiment the ferroelectric polymer 305 is PVDF. In a further embodiment, the ferroelectric polymer 305 is a PVDF-TrFE copolymer or PVDF oligomer.

The subsequent layer is another layer of immobilized palladium 306. As explained with reference to immobilized palladium 302, the immobilized palladium 306 of an embodiment improves the adhesion between the subsequently deposited plated barrier layer 307 and any underlying layer (i.e. the ferroelectric polymer) via the mechanisms described with respect to immobilized palladium 302. In an embodiment, the immobilized palladium 306 is a monolayer.

The next layer of an embodiment is a plated metal barrier 307. In an embodiment, the plated metal barrier comprises a non-reacting metal or non-reacting metal alloy. The plated metal barrier 307 of an embodiment includes CoWP, CoWPB, CoWB, CoWMoP, CoWMoPB, CoWMoB, CoWReP, CoWRePB, CoWReB, CoMoP, CoMoPB, CoMoB, CoReP, CoRePB, CoReB, CoMoReP, CoMoRePB, CoWMoReP, CoWMoReB, CoWMoReBP, CoMoReB, CoP, CoBP, or CoB. In an embodiment, the plated metal barrier 307 further includes nitrogen. As noted with reference to plated metal barrier 304, the plated metal barrier 307 decreases or prevents a reaction between the plated metal electrode 308 and the ferroelectric polymer 305 that would otherwise be in contact but for the plated metal barrier 307. The plated metal barrier 307 further decreases or prevents the diffusion and migration of the plated metal electrode 308 material into the polymer 305. The plated metal barrier 307 of an embodiment is deposited with electroless plating techniques, the features and benefits of which have been described with reference to plated metal electrode 303.

The final layer of an embodiment is a plated metal electrode 308. The plated metal electrode 308 will form, for example, word lines 210-240 as illustrated by FIG. 2. In an embodiment, the plated metal electrode 303 comprises Au, Ru, Rh, Pd, Pt, Ag, Co, Ni, Cu, Ir, Os, and/or alloys thereof with W, Mo, Re, P, B, and/or N. The plated metal electrode 303 of an embodiment is formed by electroless plating.

Figure 4:
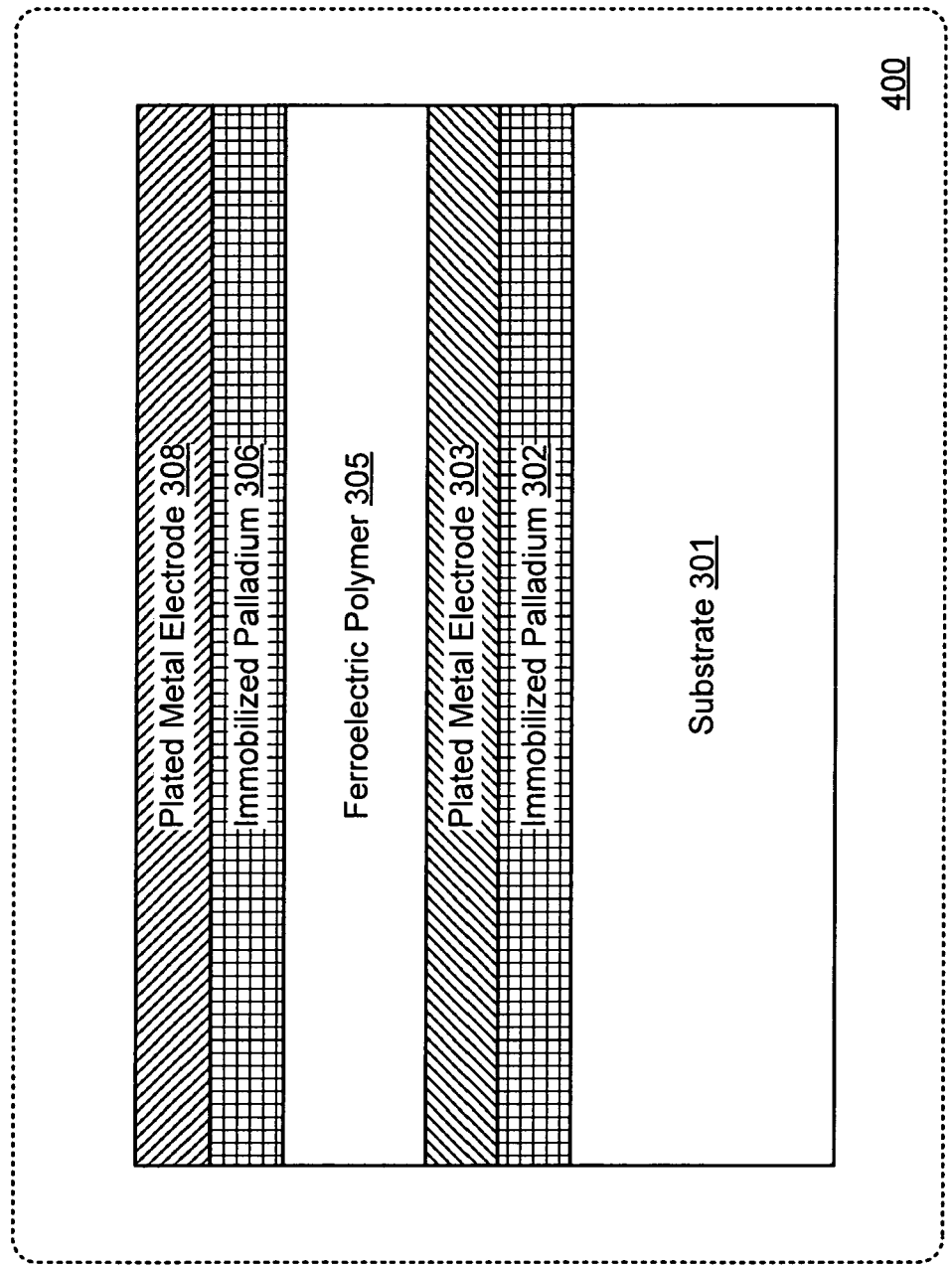
FIG. 4: illustration of a schematic cross section of a ferroelectric polymer memory device of another embodimet

FIG. 4 illustrates a schematic cross section of polymer ferroelectric memory 400 of an alternate embodiment. Polymer ferroelectric memory 400 is substantially consistent with polymer ferroelectric memory 300 (i.e., including substrate 301, immobilized palladium 302, plated metal electrode 303, ferroelectric polymer 305, immobilized palladium 306, and plated metal electrode 308), but omits plated metal barrier 304 and plated metal barrier 307. As noted, in an embodiment the plated metal electrode 303 and plated metal electrode 308 material should be compatible with the ferroelectric polymer 305 layer (i.e. the ferroelectric polymer 305 is not damaged by reactions with the plated metal electrode 303, 308 materials, or diffusion and migration into the ferroelectric polymer 305 thereby). If, as in an embodiment, the plated metal electrodes 303 and 308 are gold, either or both of the plated metal barriers 304 and 307 may be omitted. Alternatively, either the plated metal electrode 303 or the plated metal electrode 308 may be gold, in which embodiments the metal barrier adjacent to the gold electrode may be omitted.

Figure 5:
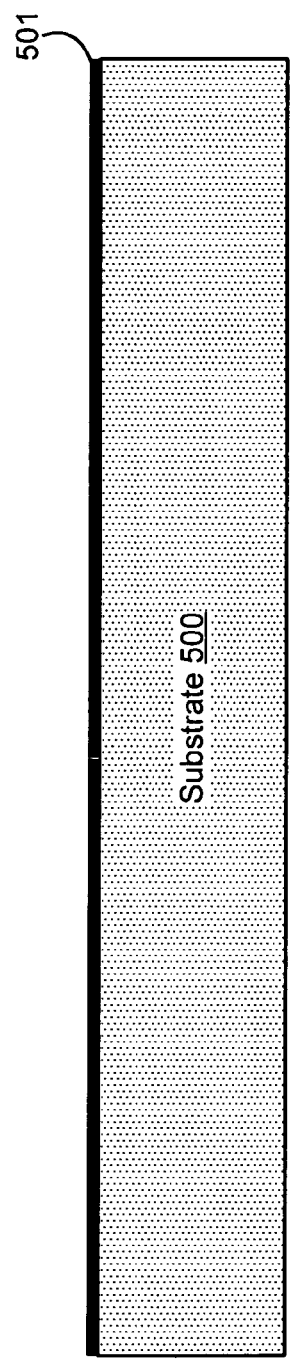
FIG. 5: illustration of a substrate cross section following the formation of an immobilized palladium catalyst

FIGS. 5 through 10 illustrate the substrate cross-sections according to the process of an embodiment to fabricate the polymer ferroelectric device illustrated schematically in FIG. 4. FIG. 5 illustrates a cross section of a substrate 500 including immobilized palladium 501. The substrate on which the immobilized palladium 501 is formed can be any substrate onto which it would be useful to fabricate a ferroelectric polymer memory device, ranging from, for example, a bulk silicon wafer to a top interconnect, dielectric, or passivation layer To form the layer of immobilized palladium 501, the substrate 500 surface is cleaned in a, for example, phosphate-based cleaning solution and then rinsed. The substrate 500 is thereafter immersed in a palladium-containing azo-silane coupling solution. The silane group of the azo-silane coupling solution attaches to the substrate 500 with the azo-group exposed. The palladium is thereafter activated by exposure to reducing agents such as hypophosphorous acid, p-dimethylaminobenzaldehyde (DMAB), and borohydrates. The activated palladium coordinate covalently bonds with the nitrogen of the exposed azo group. The hydroxyl group in the azo-silane coupling molecule helps to form, in an embodiment, a monolayer of palladium by intermolecular hydrogen bonding. The resulting wafer 500 with a layer of self-assembled azo-silane molecules complexed with palladium can then be processed in an electroless metal bath with either an immersion technique or a point-of-use spray technique to form a subsequent metal layer adjacent thereto. The immobilized palladium 501 improves adhesion between adjacent layers (e.g., substrate 500 and seed layer 600) incorporating the immobilized palladium 501 at their interface.

Figure 6:
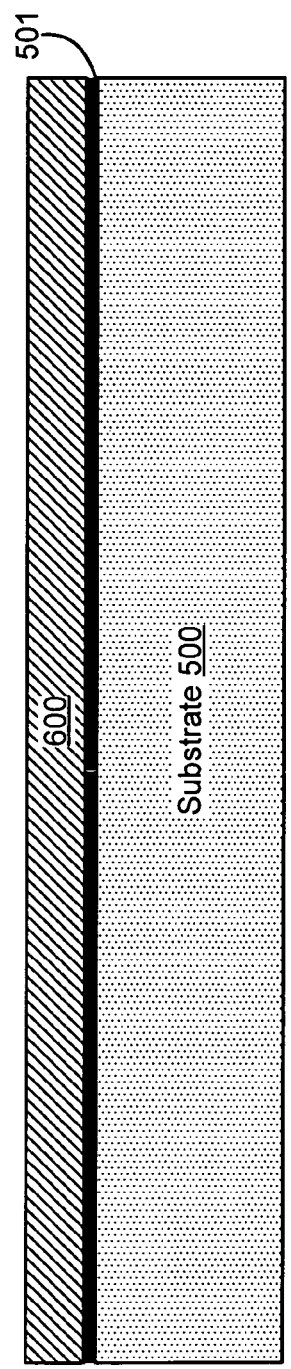
FIG. 6: illustration of the substrate cross section of FIG. 5 following the formation of a seed metal layer

FIG. 6 illustrates the substrate 500 of FIG. 5 including immobilized palladium 501 followed by the formation of a metal seed layer 600 for the plated metal electrodes 700 and 701. The metal seed layer 600 may be formed by electroless plating, chemical vapor deposition (CVD), physical vapor deposition (PVD) or atomic layer deposition (ALD). The metal seed layer 600 is important as, given an epitaxial effect, the subsequently formed plated metal electrodes 700 and 701 will substantially adopt, among other features, the texture, crystal orientation, and grain size of the underlying metal seed layer 600.

Figure 7:
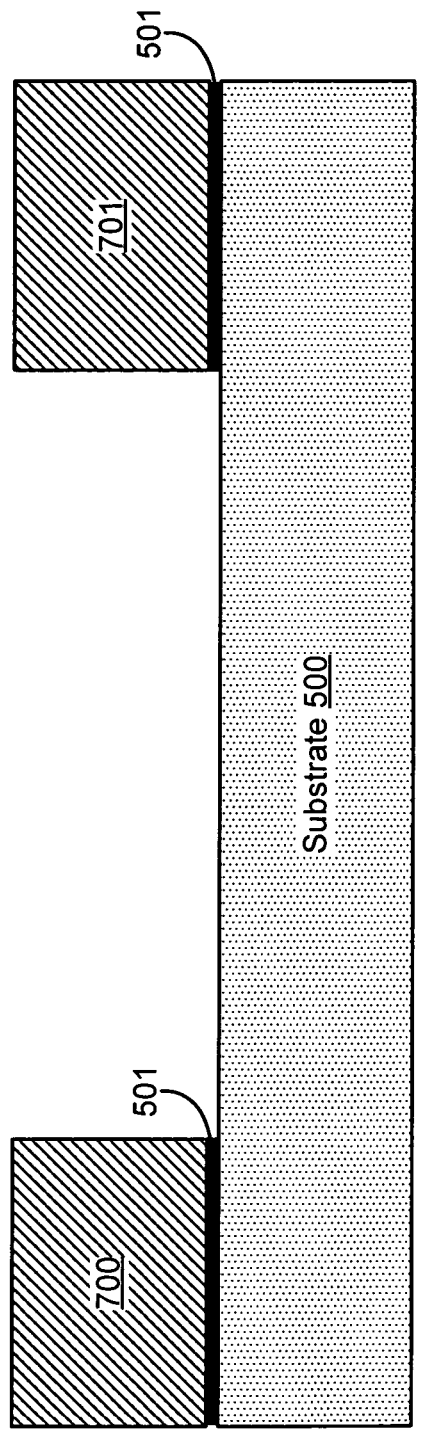
FIG. 7: illustration of the substrate cross section of FIG. 6 following the formation and patterning of a metal electrode layer

FIG. 7 illustrates the substrate of FIG. 6 following the formation and patterning of plated metal electrodes 700 and 701. As noted, given an epitaxial effect, the formed plated metal electrodes 700 and 701 will substantially adopt, among other features, the texture, crystal orientation, and grain size of the underlying seed layer 600. In an embodiment, plated metal electrodes 700 and 701 are formed with electroless plating.

Electroless plating involves the deposition of a metal coating from a solution onto a substrate by a controlled chemical reduction reaction. The metal or metal alloy being deposited generally catalyzes the controlled chemical reduction reaction. Electroless plating has several advantages over electroplating, another common plating process well known in the art. For example, electroless plating requires no electrical charge applied to the substrate, electroless plating generally results in a more uniform and nonporous metal layer on the target even when the target has an irregular shape, and electroless plating is autocatalytic and continuous once the plating process is initiated.

An electroless plating solution generally includes water, a water soluble compound containing the metal (e.g., a metal salt) to be deposited onto the substrate, a complexing agent (e.g., an organic acid or amine) that prevents chemical reduction of the metal ions in solution while permitting selective chemical reduction on a surface of the target, and a chemical reducing agent for the metal ions (e.g., hypophosphite, dimethylaminoborane (DMAB), formaldehyde, hydrazine, or borohydride). Additionally, the plating solution may include a buffer (e.g., boric acid, an organic acid, or an amine) for controlling pH and various optional additives, such as solution stabilizers (e.g., pyridine, thiourea, or molybdates) and surfactants (e.g., a glycol). It is to be understood that the composition of a plating solution will vary depending on the desired plating outcome.

The plated metal electrodes 700 and 701 may be patterned by two general methods. In an embodiment, the metal seed layer 600 may be patterned before subsequent electroless plating as the electroless plating of plated metal electrodes 700 and 701 may be selective to only those areas of exposed metal seed layer 600. Alternatively, a blanket layer of metal may be electrolessly plated with the aid of the metal seed layer 600 and thereafter patterned to form plated metal electrodes 700 and 701. The plated metal electrodes 700 and 701 of an embodiment have a thickness of approximately between 40 nanometers and 200 nanometers and in an embodiment are approximately 60 nanometers thick.

Figure 8:
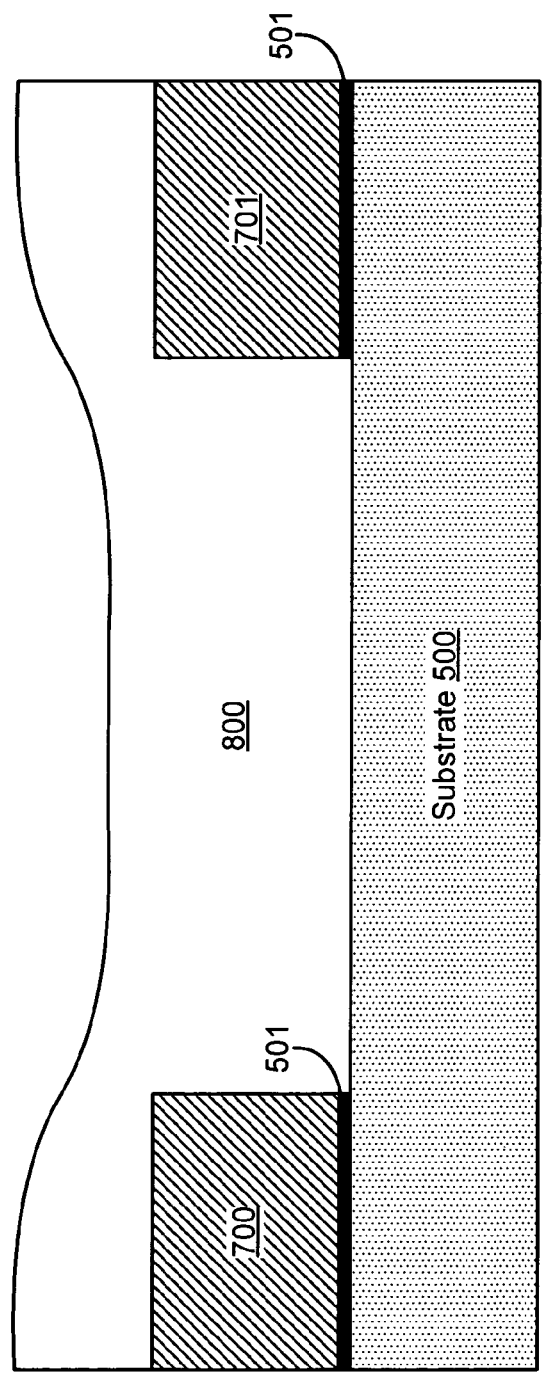
FIG. 8: illustration of the substrate cross section of FIG. 7 following the formation of a ferroelectric polymer

FIG. 8 illustrates the substrate of FIG. 7 following the formation of ferroelectric polymer 800. In an embodiment the ferroelectric polymer 800 is PVDF. In a further embodiment, the ferroelectric polymer 800 is a PVDF-TrFE copolymer with PVDF:TrFE mole ratios approximately between 60:40 and 90:10. In an embodiment, the ferroelectric polymer 800 is spin coat deposited to a thickness of approximately between 45 nanometers and 200 nanometers, and in an embodiment approximately 80 nanometers. Thereafter, the ferroelectric polymer 800 is annealed at a temperature of approximately between 100° C. and 150° C. for approximately between 60 seconds and 60 minutes. In an embodiment, the ferroelectric polymer 800 is annealed at approximately 120° C. for approximately 90 seconds.

Figure 9:
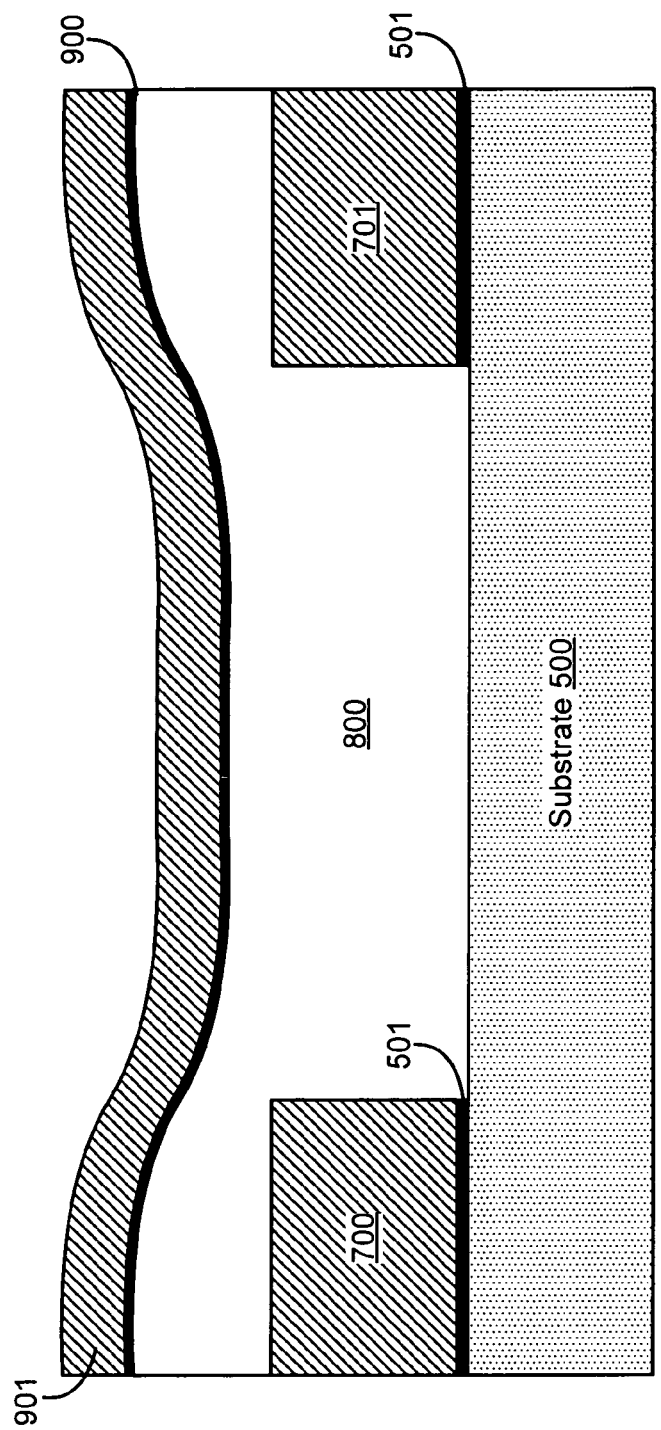
FIG. 9: illustration of the substrate cross section of FIG. 8 following the formation of another immobilized palladium catalyst and deposition of another metal seed layer

FIG. 9 illustrates the substrate of FIG. 8 following the formation of immobilized palladium 900 and metal seed layer 901. To form the layer of immobilized palladium 900, the ferroelectric polymer 800 surface is cleaned in a, for example, phosphate-based cleaning solution and then rinsed. The ferroelectric polymer 800 surface is thereafter immersed in a palladium-containing azo-silane coupling solution. The silane group of the azo-silane coupling solution attaches to the ferroelectric polymer 800 with the azo-group exposed. The palladium is thereafter activated by exposure to reducing agents such as hypophosphorous acid, p-dimethylaminobenzaldehyde (DMAB), and borohydrates. The activated palladium coordinate covalently bonds with the nitrogen of the exposed azo group. The hydroxyl group in the azo-silane coupling molecule helps to form, in an embodiment, a monolayer of palladium by intermolecular hydrogen bonding. The immobilized palladium 900 improves adhesion between adjacent layers (e.g., ferroelectric polymer 800 and metal seed layer 901) incorporating the immobilized palladium 900 at their interface.

The resulting ferroelectric polymer 800 with a layer of self-assembled azo-silane molecules complexed with palladium can be then processed in an electroless metal bath with either an immersion technique or a point-of-use spray technique to form a subsequent plated metal seed layer 901 adjacent thereto. Alternatively, the metal seed layer 901 may be formed with chemical vapor deposition (CVD), physical vapor deposition (PVD) or atomic layer deposition (ALD). The metal seed layer 901 is important as, given an epitaxial effect, the subsequently formed plated metal electrode 1000 will substantially adopt, among other features, the texture, crystal orientation, and grain size of the underlying metal seed layer 901.

Figure 10:
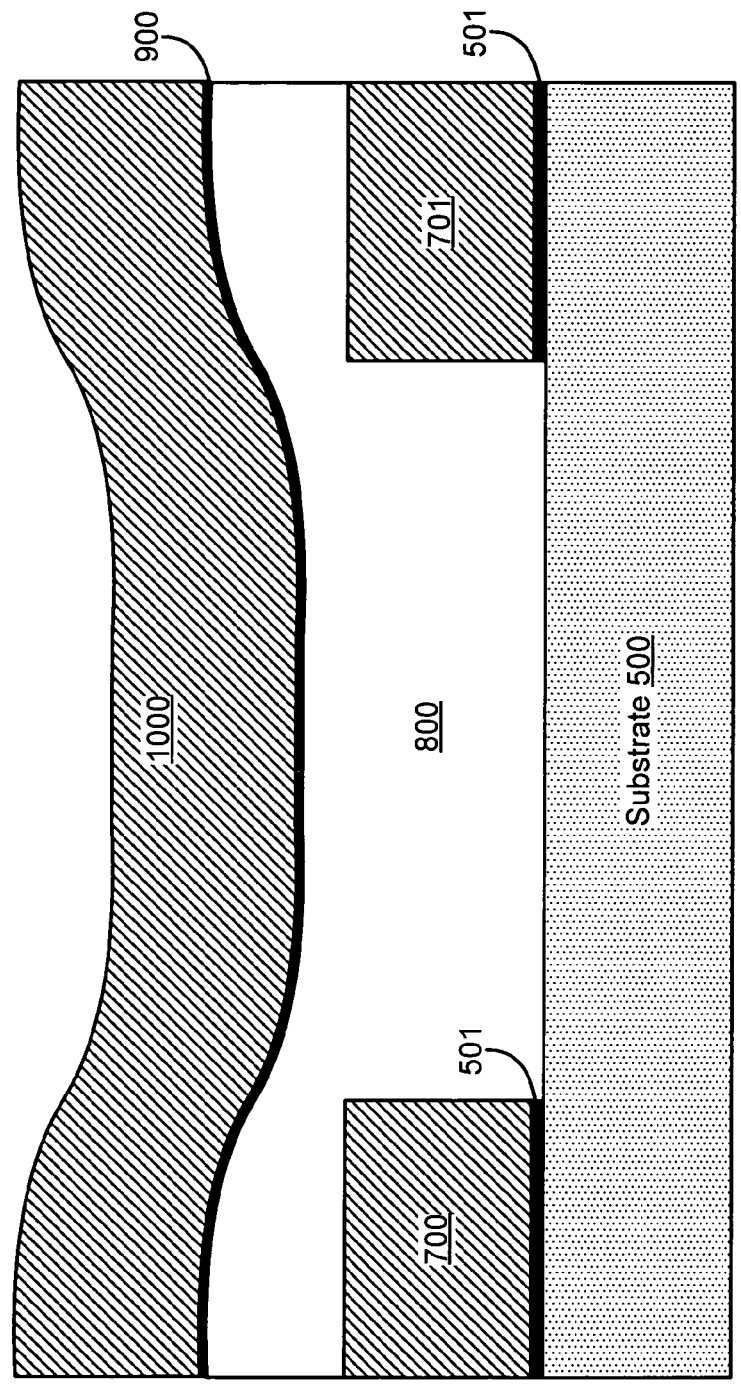
FIG. 10: illustration of the substrate cross section of FIG. 9 following the formation of another metal electrode layer

FIG. 10 illustrates the substrate of FIG. 9 following the formation of plated metal electrode 1000. The plated metal electrode 1000 may be patterned by two general methods. In an embodiment, the metal seed layer 901 may be patterned before subsequent electroless plating as the electroless plating of plated metal electrode 1000 may be selective to only those areas of exposed metal seed layer 901. Alternatively, a blanket layer of metal may be electrolessly plated with the aid of the metal seed layer 901 and thereafter patterned to form plated metal electrode 1000. The plated metal electrode 1000 of an embodiment has a thickness of approximately between 40 nanometers and 200 nanometers and in an embodiment is approximately 60 nanometers.

The electroless plating of plated metal 1000 potentially lessens the ferroelectric polymer 800 exposure to high temperature and high energy processing steps. As noted, CVD, PVD, and ALD (alternative forms of metal deposition) each potentially utilize a high deposition temperature, impart high energy flux with incident atoms or ions, or a combination thereof that may damage the underlying layer of ferroelectric polymer 800.

It is to be understood that while the structure resulting from the process illustrated by FIG. 5 through FIG. 10 represents the schematic structure illustration provided by FIG. 4, it will be clear from the discussion of FIG. 4 how the process of a further embodiment may be utilized to fabricate the structure illustrated by FIG. 3 including the plated metal barrier layers 304 and 307.

Figure 11:
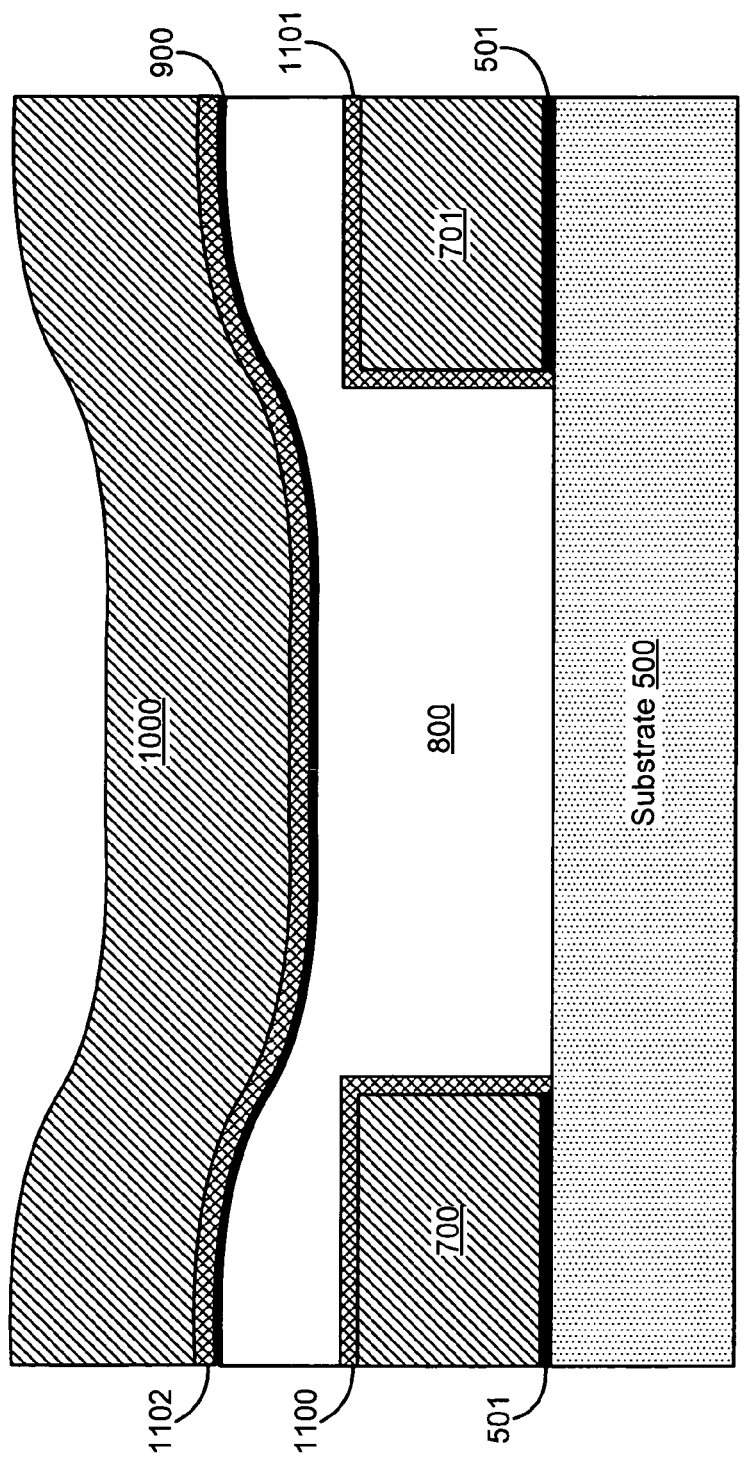
FIG. 11: illustration of the substrate cross section of FIG. 10 including plated metal barrier layers of an additional embodiment

FIG. 11 illustrates a substrate cross section corresponding to the schematic cross section illustrated by FIG. 3 including the features illustrated by FIG. 10 and plated metal barriers 1100-1102. In particular, plated metal barriers 1100 and 1101 decrease or prevent a reaction between the plated metal electrodes 700 and 701 respectively with the ferroelectric polymer 800 that would otherwise be in contact but for the plated metal barriers 1100 and 1101. Similarly, plated metal barrier 1102 decreases or prevents a reaction between the plated metal electrode 1000 with the ferroelectric polymer 800. The plated metal barriers 1100-1102 further decrease or prevent the diffusion and migration of the plated metal electrode 700, 701, and 1000 material into the ferroelectric polymer 800. The plated metal barriers 1100-1102 of an embodiment are formed with electroless plating techniques the features and benefits of which have been described herein. In an embodiment, the plated metal barriers 1100-1102 comprise a non-reacting metal or non-reacting metal alloy. The plated metal barriers 1100-1102 of an embodiment include CoWP, CoWPB, CoWB, CoWMoP, CoWMoPB, CoWMoB, CoWReP, CoWRePB, CoWReB, CoMoP, CoMoPB, CoMoB, CoReP, CoRePB, CoReB, CoMoReP, CoMoRePB, CoWMoReP, CoWMoReB, CoWMoReBP, CoMoReB, CoP, CoBP, or CoB. In an embodiment, the plated metal barriers 1100-1102 further include nitrogen.

One skilled in the art will recognize the elegance of the disclosed embodiment in that it mitigates one or more of the limiting factors of fabricating polymer ferroelectric memory devices. For example, an embodiment reduces the degradation of the ferroelectric polymer due to the polymer's reaction with, and migration or diffusion of, adjacent metal electrode material. Further, the ferroelectric polymer is exposed to fewer high temperature or high energy processes that may damage the polymer. An embodiment further incorporates an immobilized catalyst to improve the adhesion between electroless plated electrodes and adjacent layers, and in particular between the electroless plated electrodes and the ferroelectric polymer.

What is claimed is:

1. An apparatus comprising:
   a substrate;
   an adhesion layer in contact with the substrate, wherein the adhesion layer includes an immobilized metal and a plurality of self-assembled coupling molecules, wherein the immobilized metal is covalently bonded to an azo group of one of the coupling molecules;
   a metal electrode directly above and in contact with the adhesion layer; and
   a ferroelectric polymer directly above and in contact with the metal electrode.

2. The apparatus of claim 1, the ferroelectric polymer selected from the group consisting of polyvinylidene fluoride and a polyvinylidene fluoride trifluoroethylene copolymer.

3. The apparatus of claim 1, the immobilized metal comprising palladium.

4. The apparatus of claim 1, the metal electrode comprising a metal selected from the group consisting of Au, Ru, Rh, Pd, Pt, Ag, Co, Ni, Cu, Ir, and Os.

5. The apparatus of claim 4, the metal further comprising an alloy material selected from the group consisting of W, Mo, Re, P, B, N, and a combination thereof.

6. An apparatus comprising:
   a first adhesion layer including a first palladium metal covalently bonded to a first azo group of a first coupling molecule;
   a first metal electrode directly above and in contact with the first adhesion layer;
   a first metal baffler layer directly above and in contact with the first metal electrode;
   a ferroelectric polymer directly above and in contact with the first metal barrier layer;
   a second adhesion layer directly above and in contact with the ferroelectric polymer, the second adhesion layer including a second palladium metal covalently bonded to a second azo group of a second coupling molecule;

a second metal baffler layer directly above and in contact with the second adhesion layer; and a second metal electrode directly above and in contact with the second metal barrier layer.

7. The apparatus of claim 6, the ferroelectric polymer selected from the group consisting of polyvinylidene fluoride and a polyvinylidene fluoride trifluoroethylene copolymer.

8. The apparatus of claim 6, the first metal electrode and second metal electrode comprising an electrode metal selected from the group consisting of Au, Ru, Rh, Pd, Pt, Ag, Co, Ni, Cu, Ir, and Os.

9. The apparatus of claim 8, the electrode metal further comprising an alloy material selected from the group consisting of W, Mo, Re, P, B, N, and a combination thereof.

10. The apparatus of claim 6, the first metal barrier layer and the second metal barrier layer comprising a barrier metal selected from the group consisting of CoWP, CoWPB, CoWB, CoWMoP, CoWMoPB, CoWMoB, CoWReP, CoWRePB, CoWReB, CoMoP, CoMoPB, CoMoB, CoReP, CoRePB, CoReB, CoMoReP, CoMoRePB, CoWMoReP, CoWMoReB, CoWMoReBP, CoMoReB, CoP, CoBP, and CoB.

11. The apparatus of claim 10, the barrier metal further comprising nitrogen.

12. An apparatus comprising:

a first adhesion layer including a first metal covalently bonded to an azo group of a first coupling molecule;

a first metal electrode directly above and in contact with the first adhesion layer;

a ferroelectric polymer directly above and in contact with the first metal electrode;

a second adhesion layer directly above and in contact with the ferroelectric polymer, the second adhesion layer including a second metal covalently bonded to a second coupling molecule;

a second metal electrode directly above and in contact with the second adhesion layer.

13. The apparatus of claim 12, the first metal and the second metal comprising palladium.

14. The apparatus of claim 12, the ferroelectric polymer selected from the group consisting of polyvinylidene fluoride and a polyvinylidene fluoride trifluoroethylene copolymer.

15. The apparatus of claim 12, the first metal electrode and second metal electrode comprising an electrode metal selected from the group consisting of Au, Ru, Rh, Pd, Pt, Ag, Co, Ni, Cu, Ir, and Os.

16. The apparatus of claim 15, the electrode metal further comprising an alloy material selected from the group consisting of W, Mo, Re, P, B, N and a combination thereof.

17. The apparatus of claim 1 wherein the adhesion layer further includes a layer of immobilized metal covalently bonded to the plurality of self-assembled coupling molecules.

18. An apparatus comprising:

a surface;

an adhesion layer directly above and in contact with the surface, the adhesion layer including a metal covalently bonded to an azo group of a coupling molecule; and a metal layer directly above and in contact with the adhesion layer.

19. The apparatus of claim 18, wherein the surface is a ferroelectric polymer surface.

20. The apparatus of claim 18, wherein said surface is a substrate surface.

* * * * *

UNITED STATES PATENT AND TRADEMARK OFFICE
CERTIFICATE OF CORRECTION

| | | |
|---|---|---|
| PATENT NO. | : 7,709,873 B2 | Page 1 of 1 |
| APPLICATION NO. | : 11/096389 | |
| DATED | : May 4, 2010 | |
| INVENTOR(S) | : Dubin et al. | |

It is certified that error appears in the above-identified patent and that said Letters Patent is hereby corrected as shown below:

In column 8, at line 62 delete, "baffler" and insert --barrier--.

In column 9, at line 3 delete, "baffler" and insert --barrier--.

Signed and Sealed this

Twenty-third Day of November, 2010

David J. Kappos
*Director of the United States Patent and Trademark Office*